United States Patent [19]
Amatangelo et al.

[11] Patent Number: 5,636,165
[45] Date of Patent: Jun. 3, 1997

[54] APPARATUS FOR AND METHOD OF FACILITATING PROPER DATA TRANSFER BETWEEN TWO OR MORE DIGITAL MEMORY ELEMENTS

[75] Inventors: Matthew J. Amatangelo, Orlando; David T. Winkler, Oviedo, both of Fla.

[73] Assignee: Martin Marietta Corporation, Bethesda, Md.

[21] Appl. No.: 421,938

[22] Filed: Apr. 14, 1995

[51] Int. Cl.$^6$ ............................................. G11C 7/00
[52] U.S. Cl. .................. 365/194; 365/230.06; 327/141; 327/161
[58] Field of Search .............................. 365/194, 230.06; 327/141, 144, 161, 295

[56] References Cited

U.S. PATENT DOCUMENTS

| | | |
|---|---|---|
| 3,610,951 | 10/1971 | Howland . |
| 4,224,531 | 9/1980 | Ebihara et al. . |
| 4,514,647 | 4/1985 | Shoji . |
| 4,621,363 | 11/1986 | Blum . |
| 4,682,048 | 7/1987 | Ishimoto . |
| 4,688,222 | 8/1987 | Blum . |
| 5,111,063 | 5/1992 | Iwata . |
| 5,198,999 | 3/1993 | Abe et al. . |
| 5,225,723 | 7/1993 | Drako et al. . |
| 5,239,206 | 8/1993 | Yanai . |
| 5,263,173 | 11/1993 | Gleason . |

*Primary Examiner*—David C. Nelms
*Assistant Examiner*—F. Niranjan
*Attorney, Agent, or Firm*—Burns, Doane, Swecker & Mathis, L.L.P.

[57] ABSTRACT

An apparatus for and method of ensuring proper transfer of data between two registers. A device driver utilizes a clock signal as an enable input before data is transferred from one register to another. This prevents a misregistration of data when delays in propagation of the clock signal exceed delays in propagation of data signals. In alternate embodiments, provision is made for bidirectional transfer by ANDing the clock signal with directional control signals to produce the enable signal. There is also a provision for implementing the concepts of the invention in connection with a shared bus interface, and in a bidirectional interface in such a manner as to ensure a lack of bus contention.

19 Claims, 13 Drawing Sheets

PROPER OPERATION

ILLUSTRATION OF PROBLEM($TD_{CLK} > TD_{DATA}$)

APPARATUS FOR AND METHOD OF FACILITATING PROPER DATA TRANSFER BETWEEN TWO OR MORE DIGITAL MEMORY ELEMENTS

BACKGROUND

The present invention pertains to the field of digital data transfer, and, more particularly, to an apparatus for and method of facilitating proper data transfer between two or more digital memory elements such as, for example, registers.

FIGS. 1(a) through 1(c) illustrate the process of data transfer in a conventional system. FIG. 1(a) illustrates a first register 10 which receives both data and a clock signal. The arrangement of FIG. 1(a) also includes a second register 20 which is supposed to receive data from the first register 10. The output of the first data register 10 is labelled Q1 and the output of second data register 20 is labelled Q2. Propagation delays are represented as two functional blocks. The first functional block, labelled $TD_{DATA}$, represents the data propagation delay. The second functional block, labelled $TD_{CLK}$, represents the clock delay. The "clock to Q2 delay plus the data setup time" and the "register's internal clock delay" are aggregated into $TD_{DATA}$ and $TD_{CLK}$, respectively.

The timing diagrams illustrated in FIG. 1(b) represent proper data transfer through the first and second registers 10 and 20. The signal "CLOCK" serves as a common causal signal. As can be seen in FIG. 1(b), the data makes a transition from a low state to a high state in the Nth clock cycle. The output Q1 of first data register 10 accordingly makes the transition from a low state to a high state in clock cycle N+1. The output of second register 20, Q2, makes a transition from a low state to a high state in clock cycle N+2. Thus, in the situation depicted, there is an orderly transfer of data through the first register 10 to the second register 20. This proper operation is possible because the clock time or propagation delay $TD_{CLOCK}$ does not exceed the data time or propagation delay $TD_{DATA}$.

The timing diagram illustrated in FIG. 1(c) shows the problem resulting when the common causal signal ("CLOCK") experiences a greater time delay than does the data ($TD_{CLK} > TD_{DATA}$). Notice that the data of Q2 becomes a logic level "1" during cycle N+1, i.e., the second register 20 is updated with the same data as the first register 10 within the same cycle of the causal signal. Unless the first register 10 and/or the data path delay can "hold" the data long enough after the second register 20 receives CLOCK, the receiver's realization of the causal edge after the sender will cause transmission failure. This problem is more difficult to solve when the data wire is bidirectional because then the designer cannot simply input the causal signal initially to the receiver device and allow it to propagate to the sender later.

Prior practices for guaranteeing successful data transmission include providing a very high speed clock which times sequencing logic to guarantee a minimum delay between when a chip may acquire data and when it may update, employing a phase locked loop, and designing an analog delay into the enable path of the driver. Each approach has disadvantages. For example, the first approach requires a higher clock rate than that otherwise required for proper system operation. The phase locked loops required in the second approach lock to certain frequency ranges; frequencies outside of those ranges will cause spurious operation. The main disadvantage of the second approach, however, is that a minimum frequency is required. Also, the second approach is complicated and represents a significant testability problem. The third approach may be a good solution if a wide enough range of time can be specified between the minimum delay an output must hold the data and the maximum delay from the causal signal edge until the data must be valid. If this is not the case, which is very often the situation because of semiconductor process and temperature variations, the third approach is not viable.

There is thus a need for an arrangement for facilitating successful data transmission between two devices such as registers. There is a need for such an arrangement method which guarantees successful data transmission without requiring a higher clock speed or utilizing a phase locked loop. There is also still need for an approach which is not sensitive to the range of time specified between the minimum delay an output must hold data and the maximum delay from a causal signal edge until the data must be valid.

SUMMARY

The present invention involves a means of facilitating successful data transfer between two or more digital memory elements by exporting the causal signal of the receiving element to the enable input of a driver device of the sending element. This driver device is also a memory element which holds its output state unless its enable input is activated at which time its output reflects its input data. This invention is especially applicable when these digital memory elements are registers on different integrated circuit (ICs), pc boards, etc. Implementation of the approach of this invention does not require a higher clock rate than that otherwise required for the system's operation.

In one aspect, the invention is a data transfer apparatus including a first digital memory element which generates a first data output in fixed relation to an applied data signal and an applied first causal signal and a driver device, responsive to a first delayed causal signal being the first causal signal after a first causal signal propagation delay, and receiving the first data output as an input signal, the driver device setting a value of an output signal equal to a value of the input signal when enabled by the first delayed causal signal, and alternatively holding the value of the output signal constant regardless of changes in the value of the input signal when not enabled by the first delayed causal signal. The system also includes a second digital memory element which generates a second data output in fixed relation to an applied data signal and a second delayed causal signal, the second delayed causal signal being the first causal signal after a second causal signal propagation delay, the second causal signal propagation delay being less than the first causal signal propagation delay, the applied data signal being the output of the driver device.

In another aspect, the invention is embodied as a data transfer apparatus including a first digital memory element which generates a first data output in fixed relation to an applied data signal and an applied first causal signal, a driver device connected to receive the first data output as a driver input signal and producing a driver output signal, and a second digital memory element connected to receive the driver output signal as an input signal. The second digital memory element generates a second data output in fixed relation to the driver output signal and a first delayed causal signal, the first delayed causal signal being the first causal signal after a first causal signal propagation delay, where the driver device is responsive to a second delayed causal signal being the first causal signal after a second causal signal propagation delay, the driver device setting a value of the driver output signal equal to a value of the driver input signal when enabled by the second delayed causal signal, and alternatively holding the value of the driver output signal constant regardless of changes in the value of the driver input signal when not enabled by the second delayed causal signal, the second causal signal propagation delay being greater than the first causal signal propagation delay.

In another aspect, the invention is embodied as a data transfer apparatus comprising a first digital memory element which generates a first element data output in fixed relation to an applied first element input data signal and an applied first causal signal, a first logic element for forming as an output a logical product of a delayed causal signal which is the first causal signal after a first propagation delay and a first directional control signal, and a first driver device, responsive to an output of the first logic element and receiving the first data output as a first driver input signal, the first driver device setting a value of a first driver output signal equal to a value of the first driver input signal when enabled by the output of the first logic element, and alternatively holding the value of the first driver output signal constant regardless of changes in the value of the first driver input signal when not enabled by the output of the first logic element. The first digital memory element, first logic element, and the first driver device may all be contained on one chip or substrate and the delayed causal signal may then be received from circuitry on a second chip or substrate arranged to receive the first driver output signal as an input signal.

The system may be used to facilitate data transfer between two circuits or among three or more circuits. Data transfer may be one way or bidirectional. The invention also resides in related methods for facilitating data transfer.

BRIEF DESCRIPTION OF THE DRAWINGS

These and other advantages of the invention will become apparent from the following verbal description read in conjunction with the drawings, in which.

DETAILED DESCRIPTION

Figure 1A:
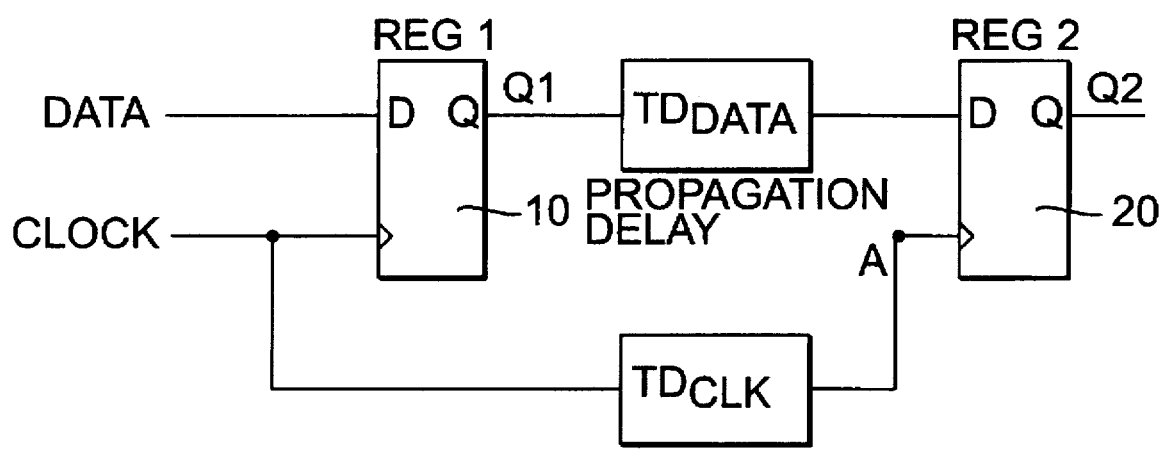
FIG. 1 (a) is a functional block diagram of a prior art data transfer arrangement.
FIG. 1(b) is a timing diagram in the case of proper data transfer through the arrangement of FIG. 1(a)
FIG. 1(c) is a timing diagram in the case of improper data transfer, and, hence, transmission failure through the arrangement of FIG. 1(a)
Figure 1B:
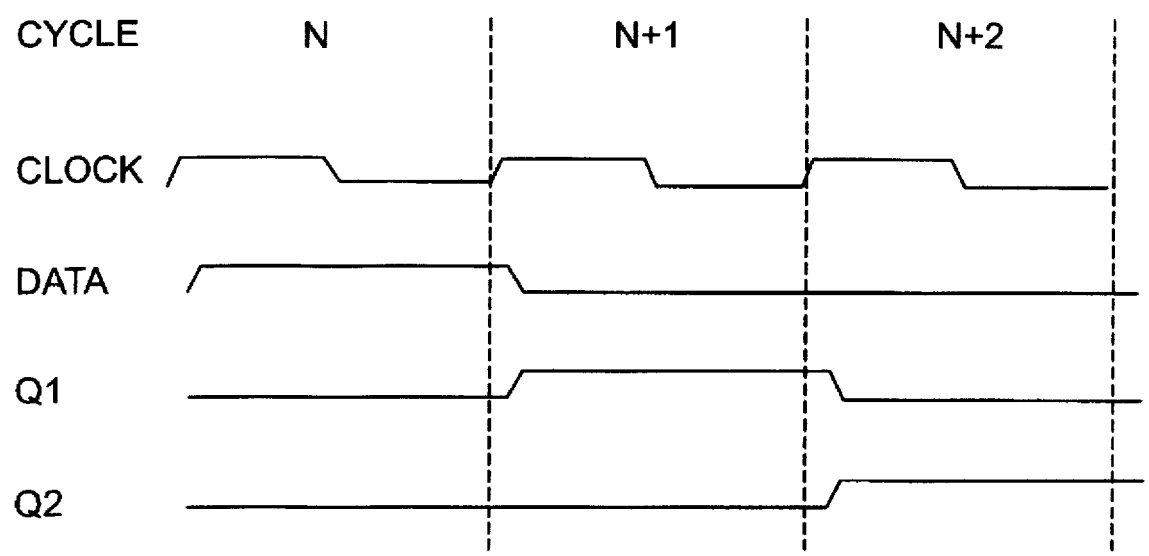
Figure 1C:
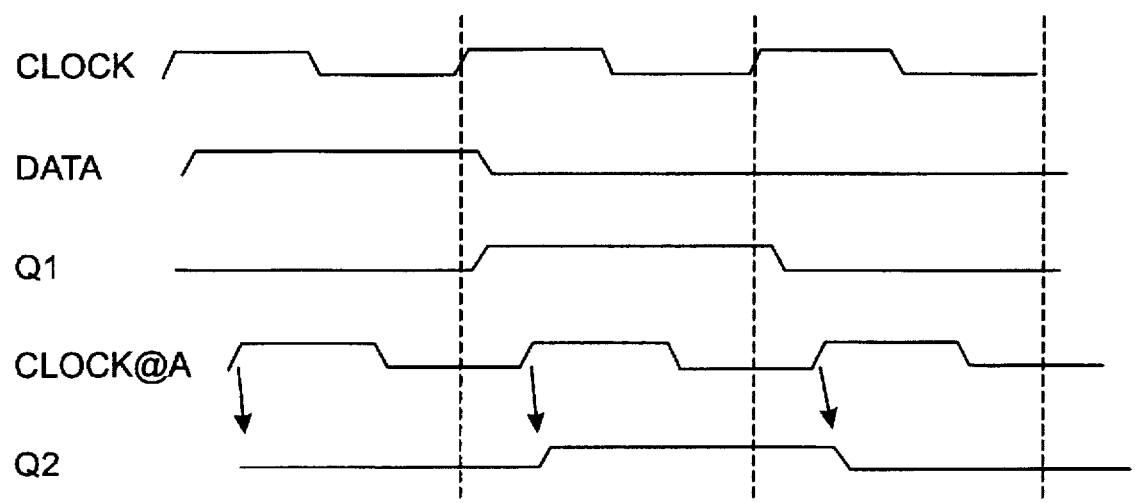
Figure 2A:
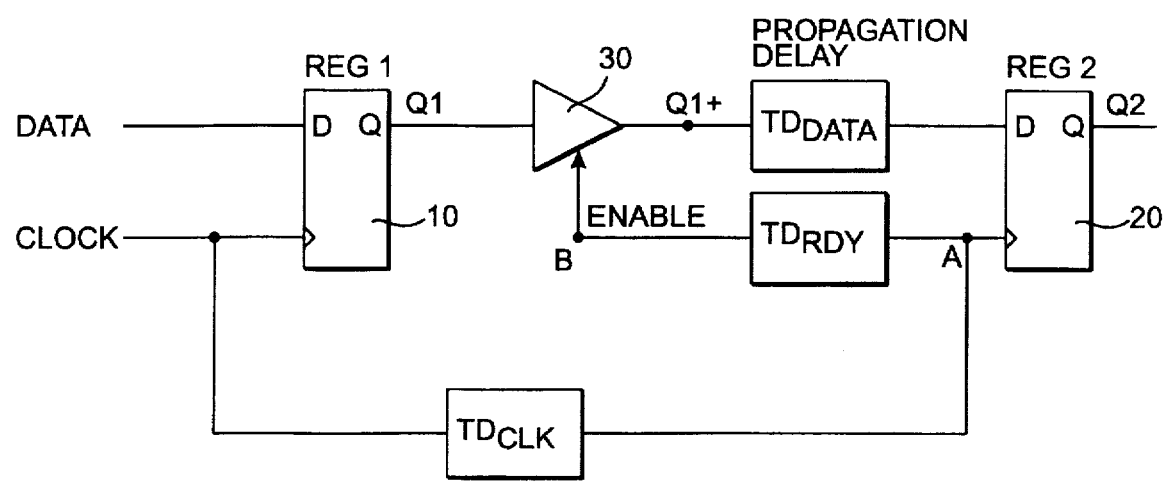
FIG. 2(a) is a functional block diagram of an arrangement for improved data transmission in accordance with an embodiment of the present invention.
Figure 2B:
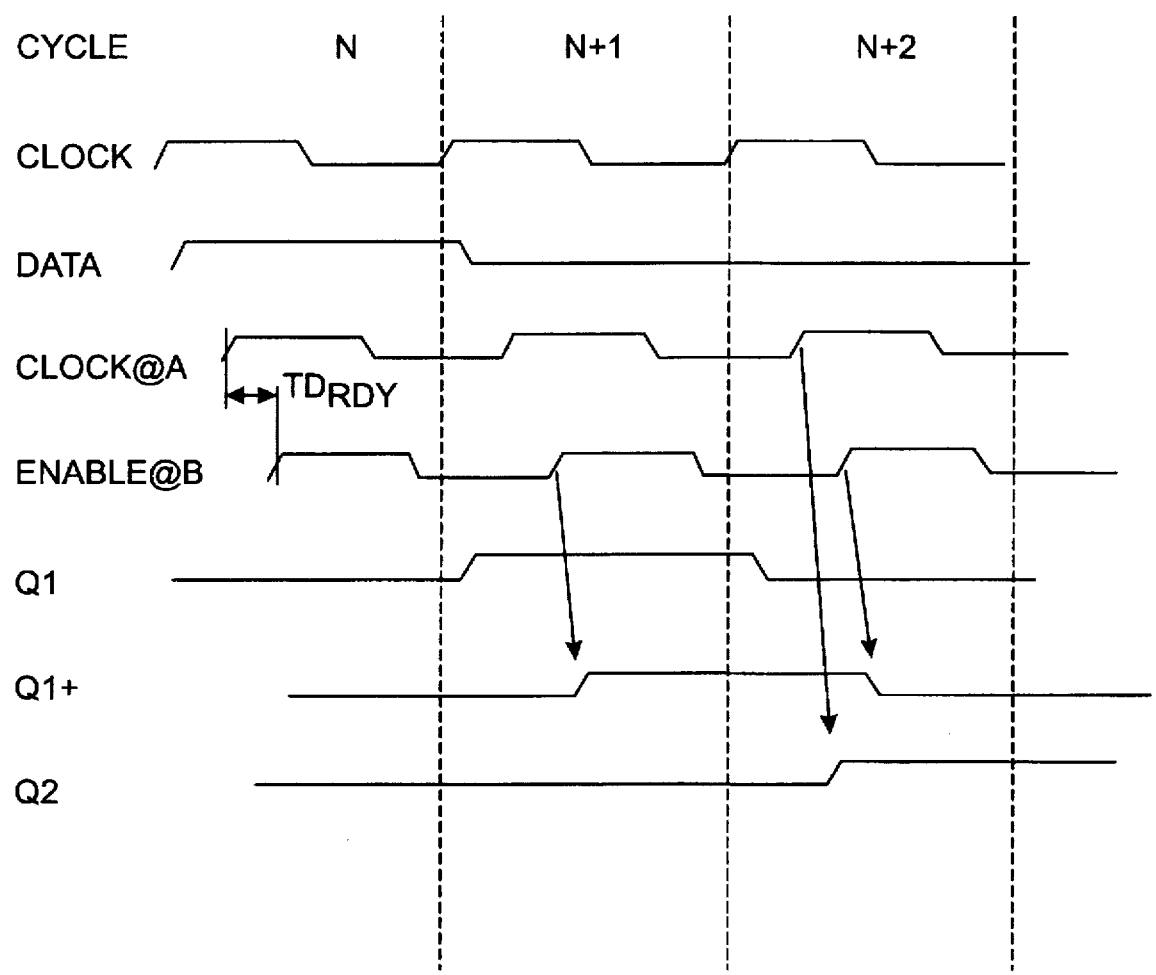
FIG. 2(b) is a timing diagram for the case of data propagation through the arrangement of FIG. 2(a)

FIGS. 2(a) and 2(b) illustrate the basic approach to solve the "hold time" problem explained in connection with FIG. 1(a) and 1(b). The driver device 30 of node Q1+will not be able to change the value of that node before the second register 20 has registered it. This is because node "A" will receive the causal edge of the clock before the enable input "B" of the driver device 30 will be asserted. The driver device 30 thus holds prior data as shown in FIG. 2(b). Note that the device driver 30 changes the output to reflect the data input only while the enable is asserted. The circuit shown in FIG. 2(a) is implemented using "D" type registers, but it will be readily apparent to one of ordinary skill in the art that the principles of the invention apply generically to systems in which data is transferred between any two or more digital memory devices.

Figure 3A:
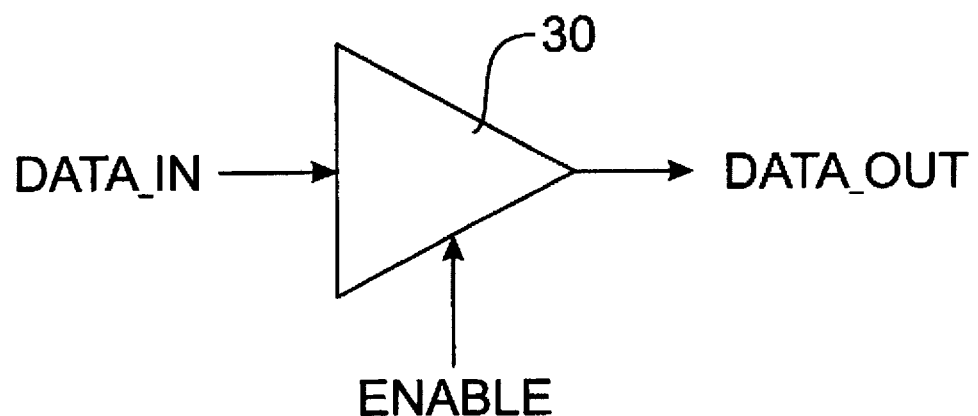
FIG. 3(a) is a functional diagram of a driver device to be used in an arrangement according to the present invention.
Figure 3B:
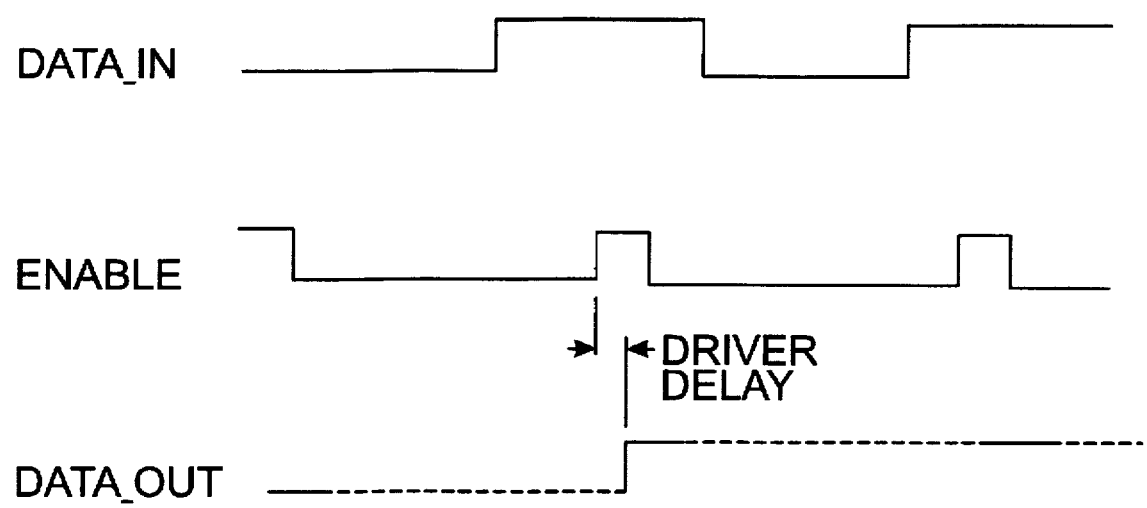
FIG. 3(b) is a timing diagram showing a mode of operation of the device of FIG. 3(a)

FIG. 3(a) is a functional diagram of an embodiment of a device driver 30 according to the present invention. As can be seen in the FIG., the device driver 30 has two inputs, a DATA_IN input and an ENABLE input. The timing diagram presented in FIG. 3(b) shows how the data output DATA_OUT is changed in response to the DATA_IN input and the ENABLE input. When the ENABLE signal is low, the output signal DATA_OUT does not change despite a change in the input signal DATA_IN until ENABLE once again goes high. Then, if the DATA_IN signal is high, DATA_OUT goes high and will remain high until the ENABLE signal and a low DATA_IN signal coincide. The bold output level on the DATA_OUT trace in FIG. 3(b) is intended to indicate that DATA_OUT is being driven by a low impedance source while the dashed line indicates a medium impedance.

Note that the device driver 30 holds its output level even when the ENABLE signal goes low. This distinguishes the device driver 30 from conventional three state drivers.

Figure 3C:
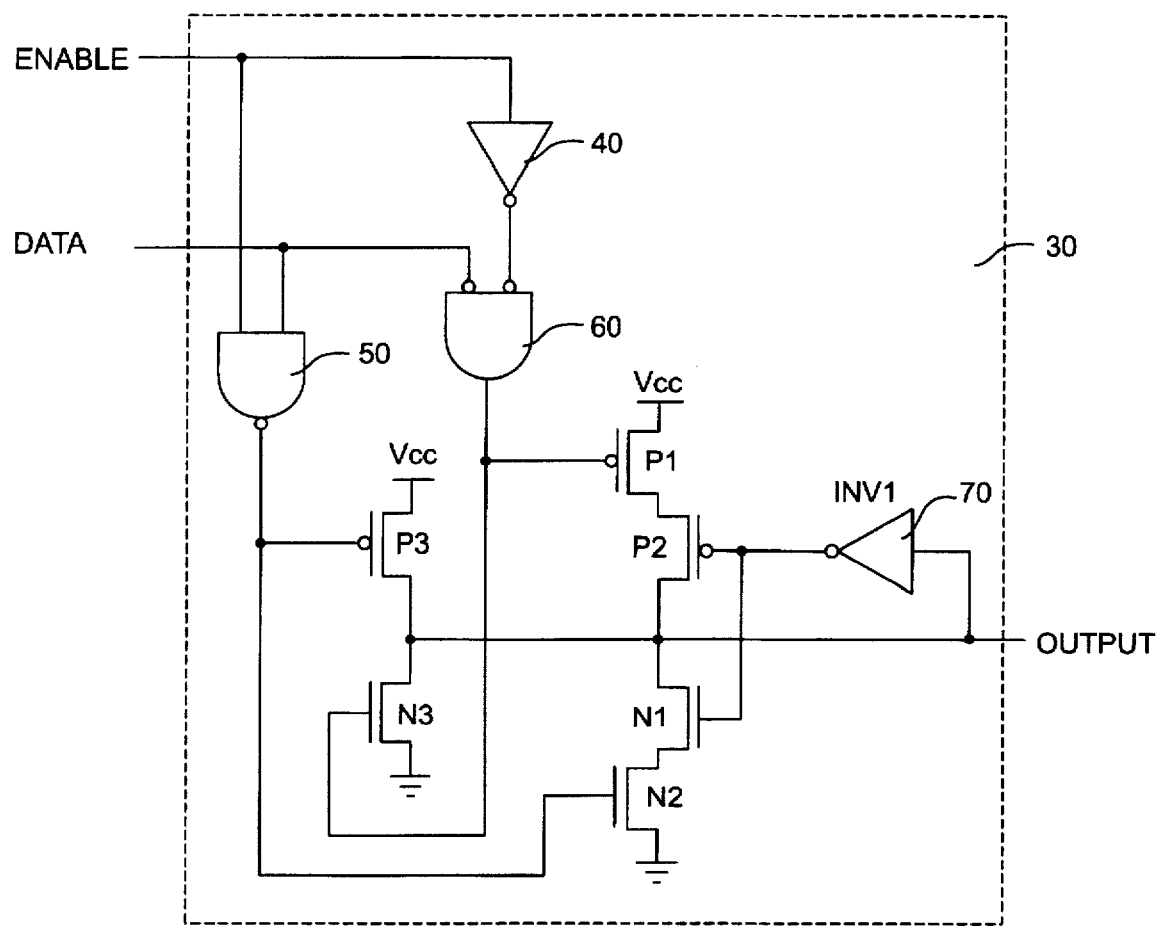
FIG. 3(c) is a circuit diagram of one possible implementation of the driver device of FIG. 3(a)

FIG. 3(c) is a CMOS logic schematic of the device driver 30. As can be seen, an ENABLE signal is provided to an inverter 40 and at the same time is provided as one of the inputs to a NAND gate 50. The DATA_IN signal is supplied as the other input to the NAND gate 50 and also to an inverting input of an AND gate 60. The inverted ENABLE signal is applied to the other inverting input of the AND gate 60.

The signal from the NAND gate 50 is used to drive the gate of a transistor N2. In the embodiment depicted, the transistor N2 is an n channel mosfet. It will be understood by one of ordinary skill in the art, however, that any appropriate switching device can be used for any of the switches used, and that all logic can be replaced with Boolean equivalents. The signal from NAND gate 50 is also used to drive the gate of p channel mosfet P3. Similarly, the output of the AND gate 60 is used to drive the gate of an n channel mosfet N3 and also the gate of a p channel mosfet P1. Transistors P3 and N3 have their drains connected together.

The drains of transistors P1 and N2 are connected together by series combination of transistor P2 and transistor N1. These two transistors also have their drains coupled together as well as being connected to the common drains of transistors P3 and N3. The output from the circuit is taken from this node. Also, the output is inverted by inverter 70 which returns the inverted signal to drive the gates of transistors P2 and N1.

In the arrangement of FIG. 3(c), the transistor pairs P1, P2 and N1, N2 (the "driving off" set) provide a much higher impedance path from the output to their respective power supplies than do P3 and N3 (the "driving on" set) which are the vehicles to pull the output high or low when the ENABLE input is asserted. P1, P2 and N1, N2 provide the output holding mechanism. As will be set forth below, when bidirectional data flow is contemplated, there is a driver on each end of the output data line. The holding transistors at the receiver's end will succumb to the driving transistors from the sender after a logic delay through INV1.

Figure 4A:
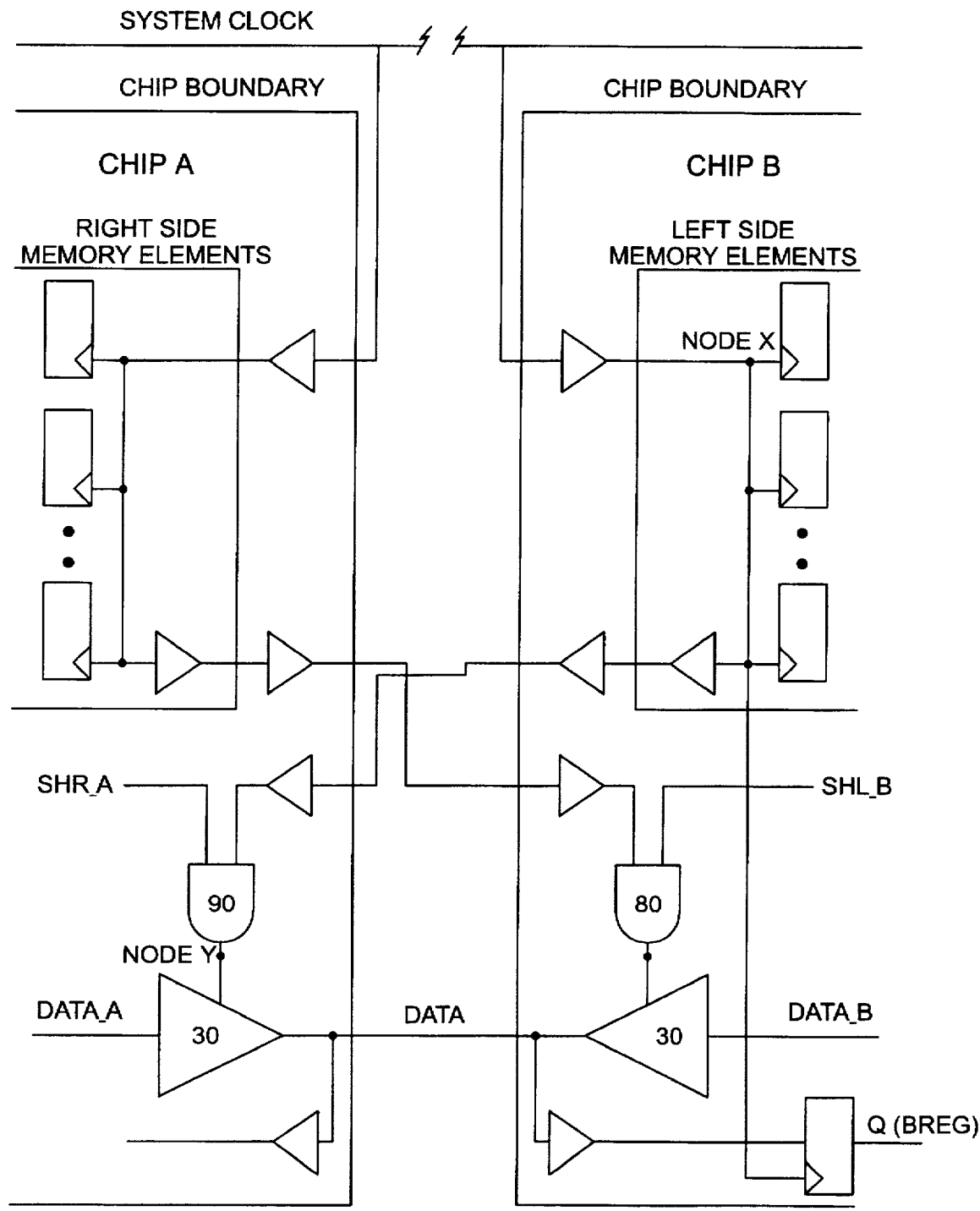
FIG. 4(a) is a functional block diagram of a possible arrangement of a bidirectional interface according to the present invention.
Figure 4B:
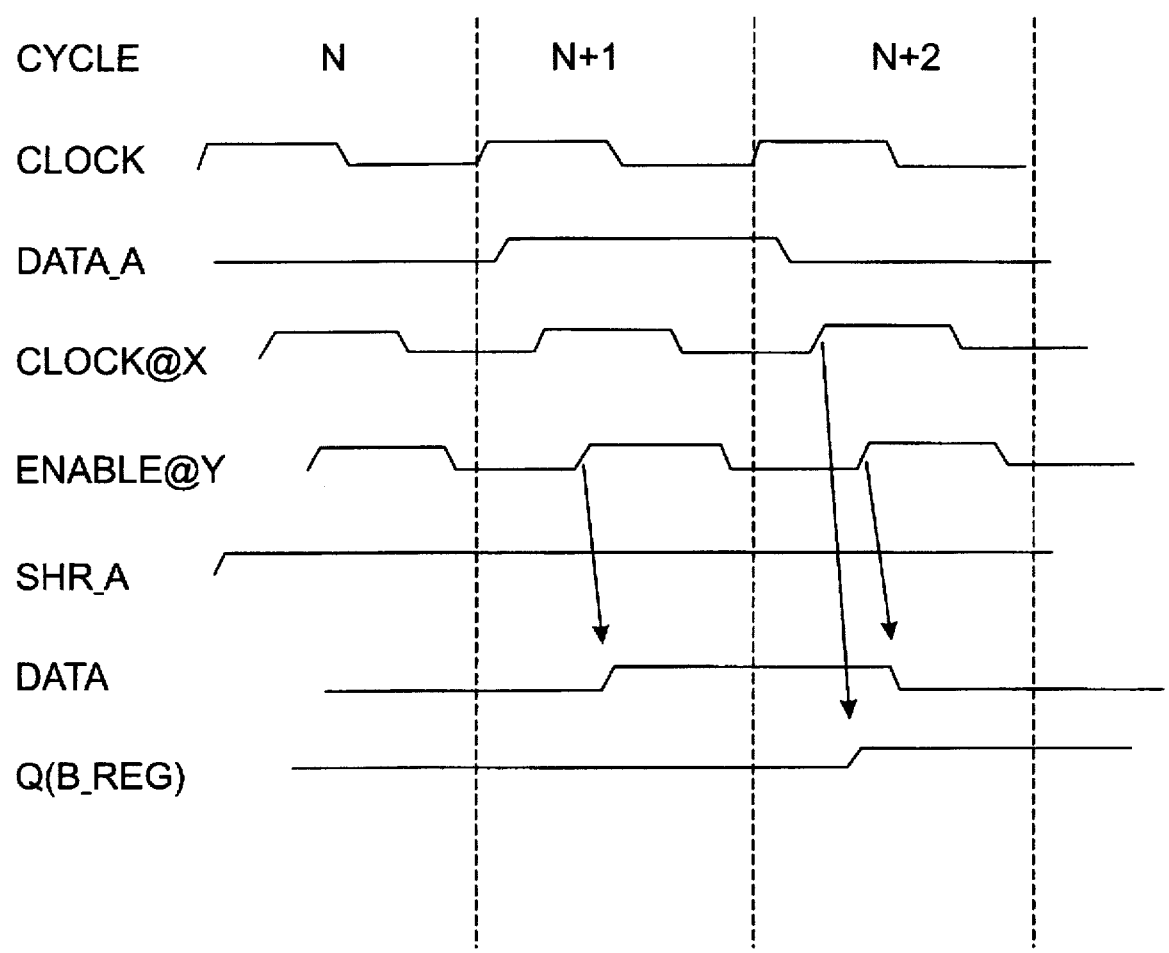
FIG. 4(b) is a timing diagram for the arrangement of FIG. 4(a)

FIG. 4(a) shows an embodiment of a bidirectional interface according to the present invention. FIG. 4(b) is a corresponding timing diagram. In FIG. 4(a), there are two chips, chip A and chip B. The system clock is supplied to the extreme right side core registers in chip A and the extreme left side core registers in chip B. The clock is then buffered (three more times in the embodiment shown) and supplied to an AND gate. In other words, the buffered clock signal off of chip A is supplied to an AND gate 80 and the buffered clock signal off of chip B is supplied to an AND gate 90. The other input for AND gate 80 is a directional control signal designated SHL_B for "shift left B." The other input for AND gate 90 is a signal designated SHR_A for "shift right A."

The signal from AND gate 80 is applied to the right hand driver device 30 which also receives the data from chip B. The output from AND gate 90 is supplied to the other driver device 30 associated with chip A as its enable signal. This other driver device 30 also receives data from chip A. Depending upon the state of the clock signal, and which directional control signal is high, data will flow to the right or to the left without concern for propagation delays since the clock of the receiving chip controls data flow.

FIG. 4(b) is made up of timing diagrams for an arrangement such as that shown in FIG. 4(a). The various signals shown are CLOCK, DATA_A, CLOCK@X (the clock at the node indicated as NODE X in FIG. 4(a)), ENABLE@Y (the ENABLE signal at NODE Y in FIG. 4(a)), DATA, and Q(BREG). The chained line indicates that the driver device 30 is in a "hold" mode. FIG. 4(b) represents a situation where data is transmitted from chip A to chip B. Although chip B receives clock edges long after chip A, chip B's registers nevertheless latch the correct data.

Figure 5:
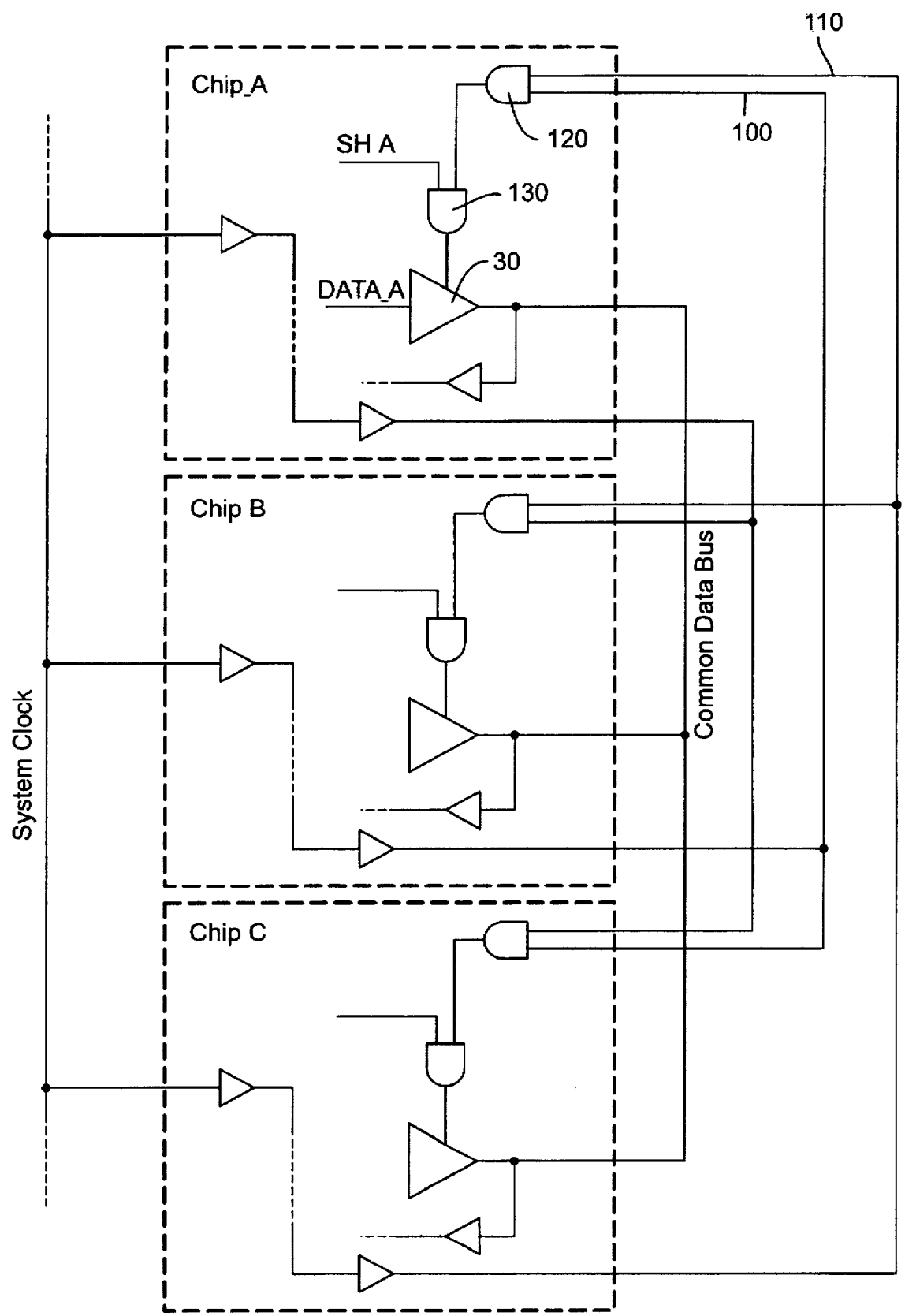
FIG. 5 is one possible arrangement for a shared bus interface according to an embodiment of the present invention.

FIG. 5 shows an embodiment of an interface according to the present invention as it might be configured where a common data bus is utilized for more than two chips. Note that only one pair of additional "enable wires" is needed for an entire bus of data. The overhead of the two additional pins is insignificant for a 32 bit bus. In FIG. 5, each chip is provided with essentially the same circuitry. The buffered system clock is provided to two enable wires, a first enable wire 100 and a second enable wire 110. The signal on these two enable wires is ANDed in each cell. For example, in chip A, it is ANDed in AND gate 120. The signal from AND gate 120 is then itself ANDed with a shift signal designated SH_A in an AND gate 130. The output of this AND gate 130 supplies an enable signal to driver device 30. This permits the driver device 30 to put DATA_A onto the common data bus. Operation in chip B and chip C is similar, so a description will not be repeated.

Immediately after power-up, the directional control signals (SHL, SHR) could cause a bus clash (i.e., two devices trying to drive opposite polarity data onto the common data line; reference FIG. 4(a) where chip A is enabled to shift left while chip B could be enabled to shift left). To avert such a situation, a configuration such as that illustrated in FIG. 6 may be employed. FIG. 6 again shows an arrangement in which there are two chips, chip A and chip B. In this arrangement, a buffer 140 is arranged to receive a data request signal in chip B. This signal is provided to the non-inverting input of an AND gate 150 through a buffer 145 on chip A. The other input of the AND gate 150 is a data request signal originating in chip A; this is provided to an inverting input of AND gate 150. Similarly, in chip A, a data request signal is buffered and ultimately supplied to an AND gate 160 at its non-inverting input. The inverting input of AND gate 160 receives the data request signal originating in chip B. These signals are then supplied as an enable signal to respective driver devices 30.

Figure 6:
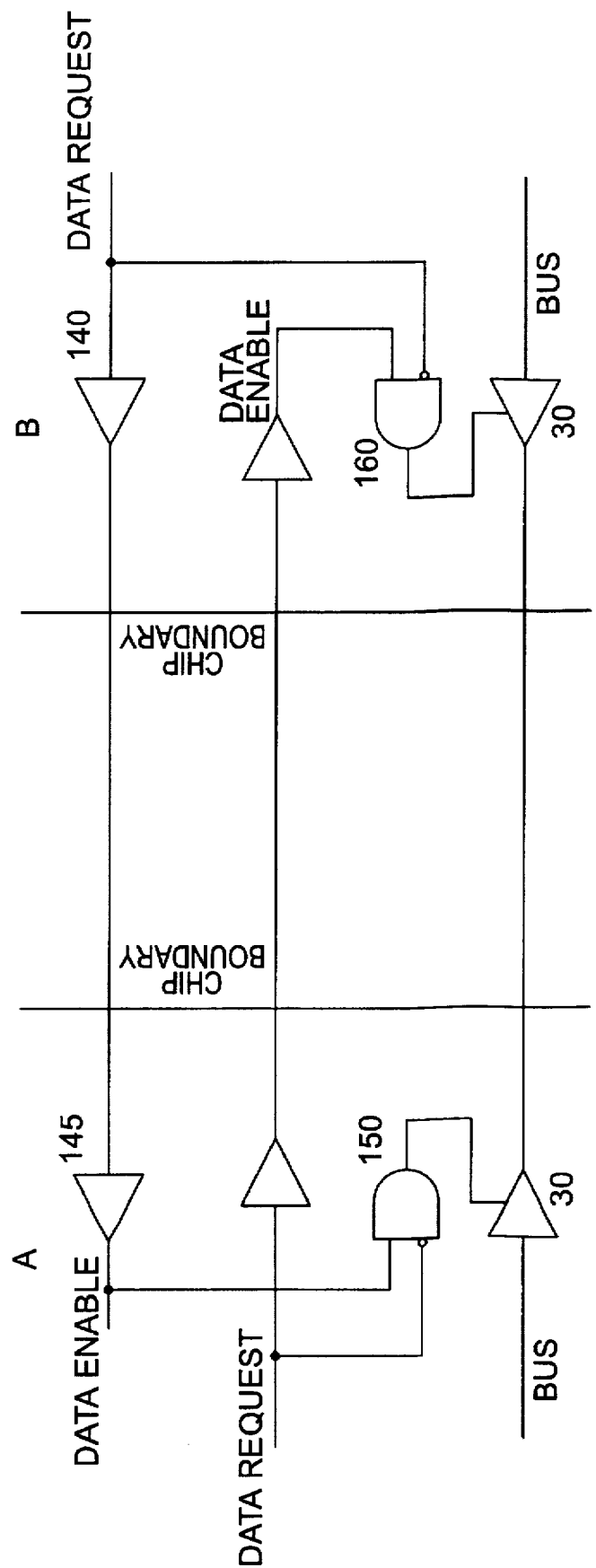
FIG. 6 is one possible implementation of an interface to assure a lack of bus contention in an arrangement according to the present invention.

The arrangement of FIG. 6 uses a pair of additional interface lines to facilitate the communication of one chip's transmission state to the other chip. The sender's driver can be enabled only if the receiver is requesting data and the sender is not requesting data. The arrangement of FIG. 6 thus prevents bus contentions which might arise if both chips were requesting or attempting to send data at the same time. The arrangement of FIG. 6, however, does not avoid bus contentions which might arise through propagation delays such as those discussed in connection with FIG. 1(a) and 1(b). Additional measures must be implemented to avoid delays of such a nature.

Figure 7:
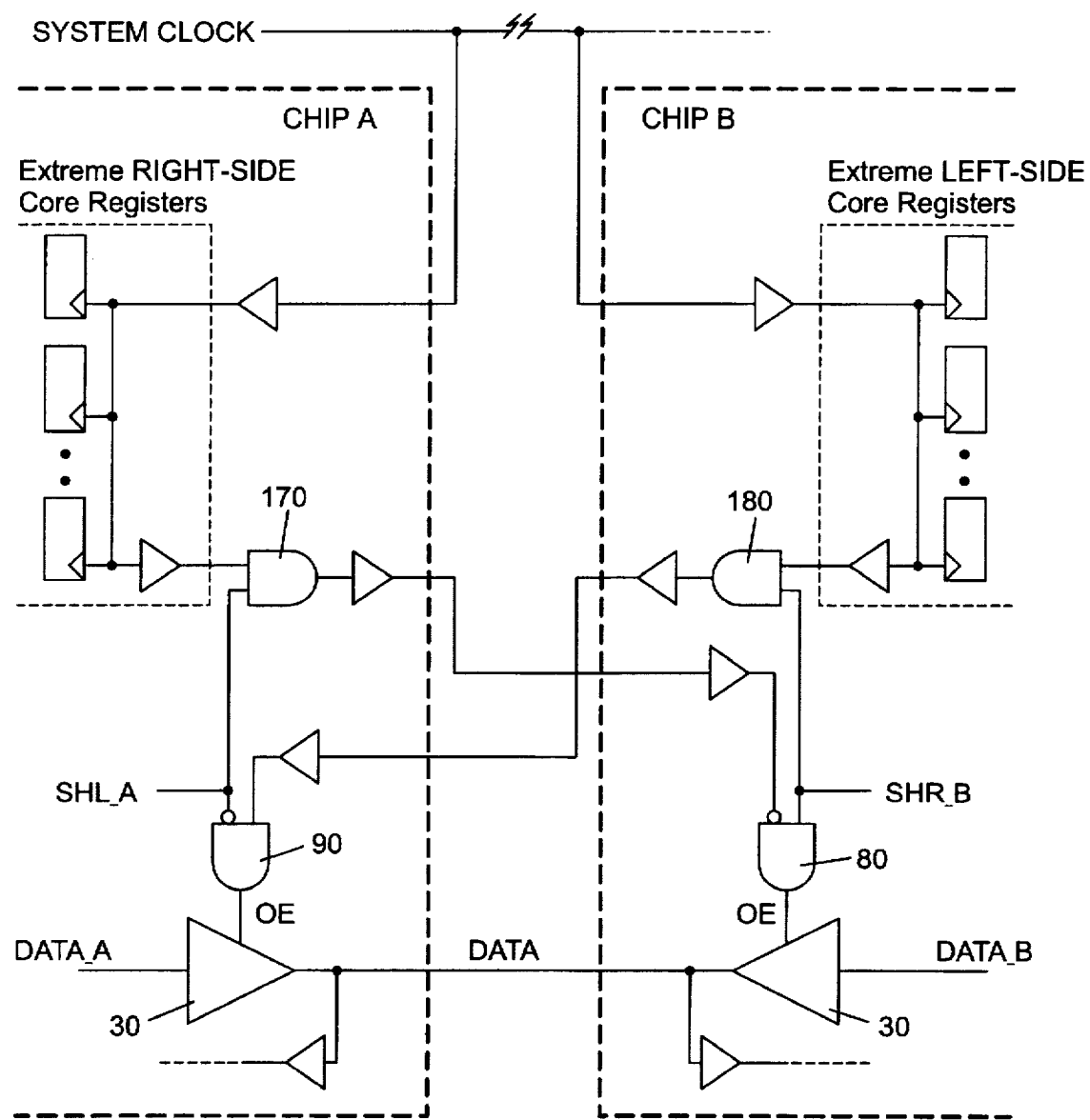
FIG. 7 is a functional block diagram of an arrangement incorporating both the shared bus interface and an interface designed to assure lack of bus contention.

FIG. 7 illustrates an integration of the ideas shown in FIGS. 4(a) and 6. Again, there are two chips, chip A and chip B. The buffered system clock is provided to the extreme right side core registers of chip A and the extreme left side core registers of chip B. The clock signal coming off chip, however, instead of being simply buffered, is ANDed.

More specifically, the buffered system clock signal coming off of chip A is ANDed in AND gate 170. The other input for AND gate 170 is the directional control signal SHL_A. In a similar fashion, the buffered system clock coming off of chip B is ANDed in AND gate 180 with the directional control signal SHR_B. It is these signals which are supplied to AND gates 90 and 80 which are similar to those shown in FIG. 4(a). Hence, this illustration avoids bus clash and guarantees that the sender holds data a sufficiently long period of time for successful transmission despite clock skew.

With respect to the above approach to avoiding bus clashes after power-up, if many serial lines were present on a particular design, the above approach would present significant overhead. One alternative is to employ a power-on-reset circuit and reset logic which will maintain a disable state until specifically altered by an instruction. It is usually not the case, however, that many serial lines are present on a particular design. The typical case would be a situation with large parallel busses which render the conventional approach less efficient than that described above.

The invention has been described above in connection with specific embodiments. It will be readily appreciated by one of ordinary skill in the art that these embodiments are merely illustrative. The invention is not limited to these embodiments, and, indeed, one of ordinary skill in the art can readily develop other embodiments incorporating the essential principles of the invention. The invention should therefore not be regarded as being limited by the above embodiments, but instead as being fully commensurate in scope with the following claims.

What is claimed is:

1. A data transfer apparatus comprising:
a first digital memory element which generates a first data output in fixed relation to an applied data signal and an applied first causal signal; and
a driver device having an input terminal, an output terminal, and an enable terminal, said driver device being responsive to a first delayed causal signal applied to said enable terminal, said first delayed causal signal being said first causal signal after a first causal signal propagation delay, and receiving said first data output as an input signal at said input terminal, said driver device causing a value of an output signal at said output terminal to be equal to a value of said input signal at said input terminal when said first delayed causal signal as applied to said enable terminal makes a transition to a predetermined voltage level, and alternatively holding the value of said output signal constant regardless of the value of said input signal when said first delayed causal signal as applied to said enable terminal does not make a transition to said predetermined voltage level.

2. A data transfer apparatus as claimed in claim 1, further comprising:
a second digital memory element which generates a second data output in faced relation to an applied data signal and a second delayed causal signal, said second delayed causal signal being said first causal signal after a second causal signal propagation delay, said second causal signal propagation delay being less than said first causal signal propagation delay, said applied data signal being the output of said driver device.

3. A data transfer apparatus comprising:
a first digital memory element which generates a first data output in fixed relation to an applied data signal and an applied first causal signal;
a driver device connected to receive said first data output as a driver input signal and producing a driver output signal; and
a second digital memory element connected to receive said driver output signal as an input signal, said second digital memory element generating a second data output in fixed relation to said driver output signal and a first delayed causal signal, said first delayed causal signal being said first causal signal after a first causal signal propagation delay,
said driver device being responsive to a second delayed causal signal being said first causal signal after a second causal signal propagation delay, said driver device setting a value of said driver output signal equal to a value of said driver input signal when enabled by said second delayed causal signal, and alternatively holding the value of said driver output signal constant regardless of changes in the value of said driver input signal when not enabled by said second delayed causal signal, said second causal signal propagation delay being greater than said first causal signal propagation delay.

4. An apparatus as claimed in claim 3 wherein said applied causal signal is a system clock signal.

5. An apparatus as claimed in claim 3 wherein said first digital memory element comprises a register.

6. An apparatus as claimed in claim 5 wherein said register comprises a D-type flip-flop.

7. An apparatus as claimed in claim 3, wherein said driver device comprises:
first means for forming a first logical product of said first dam output and said second delayed causal signal;
second means for forming a second logical product of said first data output and said second delayed causal signal;
a first switching element, controlled by an output of said first means, for selectably connecting an output node to a first voltage level when the output of said first means has a first logical value;
a second switching element, controlled by an output of said second means, for selectably connecting an output node to a second voltage level different from said first voltage level when the output of second means has a first logical value;
third and fourth switching elements, arranged in series, the third switching element being controlled by the output of the second means, and the fourth switching element being controlled by the value of a voltage on the output line, for selectably connecting said output node to said first voltage level; and
fifth and sixth switching elements, arranged in series, the fifth switching element being controlled by the output of the second means, and the sixth switching element being controlled by the value of the voltage on the output line, for selectably connecting the output line to said second voltage level.

8. A data transfer apparatus comprising:
a first digital memory element which generates a first element data output in fixed relation to an applied first element input data signal and an applied first causal signal;
a first logic element for forming as an output a logical product of a delayed causal signal which is said first causal signal after a first propagation delay and a first directional control signal; and
a first driver device, responsive to an output of said first logic element and receiving said first data output as a first driver input signal, said first driver device setting a value of a first driver output signal equal to a value of said first driver input signal when enabled by said output of said first logic element, and alternatively holding the value of said first driver output signal constant regardless of changes in the value of said first driver input signal when not enabled by said output of said first logic element.

9. A data transfer apparatus as claimed in claim 8, wherein said first digital memory element, first logic element, and said first driver device are all contained on a first substrate, and wherein said delayed causal signal is received from circuitry on a second substrate arranged to receive said first driver output signal as an input signal.

10. A data transfer apparatus comprising:
a first digital memory element which generates a first element data output in fixed relation to an applied first element input data signal and an applied causal signal;
a first logic element for forming as an output a logical product of said causal signal and a first directional control signal;
a first driver device, responsive to an output of said first logic element and receiving said first data output as a first driver input signal, said first driver device setting a value of a first driver output signal equal to a value of said first driver input signal when enabled by said output of said first logic element, and alternatively holding the value of said first driver output signal constant regardless of changes in the value of said first driver input signal when not enabled by said output of said first logic element;

a second digital memory element which generates a second element data output in fixed relation to an applied second element input data signal and said causal signal;

a second logic gate which receives said causal signal as one input and a second directional control signal as a second input;

a second driver device, responsive to an output of said second logic gate and receiving said second data output as a second driver input signal, said second driver device setting a value of a second driver output signal equal to a value of said second driver input signal when enabled by said output of said second logic gate, and alternatively holding the value of said second driver output signal constant regardless of changes in the value of said second driver input signal when not enabled by said output of said second logic gate, wherein said first digital memory element, said first logic element, and said first driver device are on a first substrate, said second digital memory element, said second logic element, and said second driver device are on a second substrate, and said causal signal is a system clock signal, said apparatus being arranged such that said causal signal travels in order from said first digital memory element to said second logic gate, and in order from said second digital memory to said first logic gate.

11. A data transfer apparatus comprising:

a first digital memory element which generates a first element data output in fixed relation to an applied first element input data signal and an applied causal signal;

a second digital memory element which generates a second element data output in fixed relation to an applied second element input data signal and said causal signal;

a third digital memory element which generates a third element data output in fixed relation to an applied third element input data signal and said causal signal;

a first logic gate which forms as an output a logical product of said causal signal as received from said second digital memory element and said causal signal as received from said third digital memory element;

a second logic gate which forms as an output a logical product of said output of said first logic gate and a first directional control signal; and a first driver device, responsive to said output of said second logic gate and receiving said first element data output as a first driver input signal, said first driver device setting a value of a first driver output signal to be output to a common data bus equal to a value of said first driver input signal when enabled by said output of said second logic gate, and alternatively holding the value of said first driver output signal constant regardless of changes in the value of said first driver input signal when not enabled by said output of said second logic gate.

12. A data transfer apparatus as claimed in claim 11, further comprising:

a third logic gate which forms as an output a logical product of said causal signal as received from said first digital memory element and said causal signal as received from said third digital memory element;

a fourth logic gate which forms as an output a logical product of said output of said third logic gate and a second directional control signal; and a second driver device, responsive to said output of said fourth logic gate and receiving said second element data output as a second driver input signal, said second driver device setting a value of a second driver output signal to be output to said common data bus equal to a value of said second driver input signal when enabled by said output of said fourth logic gate, and alternatively holding the value of said second driver output signal constant regardless of changes in the value of said second driver input signal when not enabled by said output of said fourth logic gate.

13. A data transfer apparatus as claimed in claim 12, further comprising:

a fifth logic gate which forms as an output a logical product of said causal signal as received from said first digital memory element and said causal signal as received from said second digital memory element;

a sixth logic gate which forms as an output a logical product of said output of said fifth logic gate a third directional control signal; and a third driver device, responsive to said output of said sixth logic gate and receiving said third element data output as a third driver input signal, said third driver device setting a value of a third driver output signal to be output to said common data bus equal to a value of said third driver input signal when enabled by said output of said sixth logic gate, and alternatively holding the value of said third driver output signal constant regardless of changes in the value of said third driver input signal when not enabled by said output of said sixth logic gate.

14. A data transfer apparatus comprising:

a first digital memory element which generates a first element data output in fixed relation to an applied first element input data signal and an applied causal signal;

a second digital memory element which generates a second element data output in fixed relation to an applied second element input data signal and said applied causal signal;

a first logic gate which forms as an output a logical product of said applied causal signal as received from said first digital memory element and a first directional control signal;

a second logic gate which forms as an output a logical product of said applied causal signal as received from said second digital memory element and a second directional control signal;

a third logic gate which forms as an output a logical product of said output of the second logic gate and the first directional control signal;

a fourth logic gate which forms as an output the logical product of said output of the first logic gate and the second directional control signal;

a first driver device, responsive to an output of said third logic gate and receiving said first data output as a first driver input signal, said first driver device setting a value of a first driver output signal equal to a value of said first driver input signal when enabled by said output of said third logic gate, and alternatively holding the value of said first driver output signal constant regardless of changes in the value of said first driver input signal when not enabled by said output of said third logic gate; and a second driver device, responsive to an output of said fourth logic gate and receiving said second data output as a second driver input signal, said second driver device setting a value of a second driver output signal equal to a value of said second driver input signal when enabled by said output of said fourth logic gate, and alternatively holding the value of said second driver output signal constant regardless of changes in the value of said second driver input signal when not enabled by said output of said fourth logic gate.

15. A data transfer method comprising the steps of:

generating a first element data output in fixed relation to an applied data signal and an applied causal signal, said first data output being for receipt by a second element;

applying said first data output as an input signal to a driver device; and using said causal signal as received from said second element to enable said driver device to set a value of an output signal of the driver device equal to a value of said first data output.

16. A method as claimed in claim 15 wherein said applied causal signal is a system clock signal.

17. A data transfer method comprising the steps of:

generating a first element data output in fixed relation to an applied first element input data signal and an applied causal signal, said first data output being for receipt by a second element;

forming a logical product of said applied causal signal as received from said second element and a first directional control signal; and setting a value of a first driver output signal equal to a value of said first driver input signal when enabled by said logical product, and alternatively holding the value of said first driver output signal constant regardless changes in the value of said first driver input signal when not enabled by said logical product.

18. A data transfer method comprising the steps of:

generating a first element data output in fixed relation to an applied first element input data signal and an applied causal signal, said first element data output being for receipt by at least one of a second element and a third element;

generating a first logical product of said applied causal signal as received from said second element and an applied causal signal as received from said third element;

generating a second logical product of said first logical product and a first directional control signal; and setting a value of a first driver output signal to be output to a common data bus equal to a value of said first driver input signal when enabled by said second logical product, and alternatively holding the value of said first driver output signal constant regardless of changes in the value of said first driver input signal when not enabled by said second logical product.

19. A data transfer method comprising the steps of:

causing a first digital memory element to generate a first element data output in fixed relation to an applied first element input data signal and an applied causal signal, said first element data output being for receipt by a second digital memory element;

forming a first logical product of said applied causal signal as received from said first digital memory element a first directional control signal;

forming a second logical product of an applied causal signal as received from a second digital memory element and a second directional control signal;

forming a third logical product of said second logical product and said first directional control signal;

forming a fourth logical product of the first logical product and said second directional control signal;

setting a value of a first driver output signal equal to a value of a first driver input signal when enabled by said third logical product, and alternatively holding the value of the first driver output signal constant regardless of changes in the value of said first driver input signal when not enabled by said third logical product; and setting a value of a second driver output signal equal to a value of a second driver input signal when enabled by said fourth logical product, and alternatively holding the value of said second driver output signal constant regardless of changes in the value of said second driver input signal when not enabled by said fourth logical product.

* * * * *

UNITED STATES PATENT AND TRADEMARK OFFICE
CERTIFICATE OF CORRECTION

PATENT NO. : 5,636,165
DATED : June 3, 1997
INVENTOR(S) : Mathew J. AMATANGELO et al It is certified that error appears in the above-indentified patent and that said Letters Patent is hereby corrected as shown below:

Column 7, line 25, (Claim 2) change "faced" to --fixed--;

Column 7, line 67, (Claim 7) change "dam" to --data--.

Signed and Sealed this

Seventh Day of October, 1997

*Attest:*

BRUCE LEHMAN

*Attesting Officer*     *Commissioner of Patents and Trademarks*